(12) United States Patent
Lee

(10) Patent No.: US 10,121,940 B1
(45) Date of Patent: Nov. 6, 2018

(54) VEHICLE LAMP USING SEMICONDUCTOR LIGHT EMITTING DEVICE

(71) Applicant: LG ELECTRONICS INC., Seoul (KR)

(72) Inventor: Eunah Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/499,049

(22) Filed: Apr. 27, 2017

(51) Int. Cl.
*H01L 33/00* (2010.01)
*H01L 33/46* (2010.01)
*H01L 33/38* (2010.01)
*H01L 33/62* (2010.01)
*H01L 33/50* (2010.01)
*H01L 33/32* (2010.01)
*H01L 33/06* (2010.01)
*H01L 25/075* (2006.01)
*B60Q 1/30* (2006.01)
*B60Q 1/44* (2006.01)
*B60Q 1/34* (2006.01)
*B60Q 1/22* (2006.01)
*B60Q 1/26* (2006.01)
*F21S 43/14* (2018.01)
*F21Y 115/10* (2016.01)

(52) U.S. Cl.
CPC ............ *H01L 33/46* (2013.01); *B60Q 1/22* (2013.01); *B60Q 1/2696* (2013.01); *B60Q 1/30* (2013.01); *B60Q 1/34* (2013.01); *B60Q 1/44* (2013.01); *F21S 43/14* (2018.01); *H01L 25/0753* (2013.01); *H01L 33/06* (2013.01); *H01L 33/32* (2013.01); *H01L 33/38* (2013.01); *H01L 33/502* (2013.01); *H01L 33/62* (2013.01); *B60Q 2400/20* (2013.01); *F21Y 2115/10* (2016.08)

(58) Field of Classification Search
None
See application file for complete search history.

(56) References Cited

U.S. PATENT DOCUMENTS

| 2007/0114552 A1* | 5/2007 | Jang | H01L 33/46 |
| | | | 257/98 |
| 2010/0237371 A1* | 9/2010 | Kang | H01L 33/44 |
| | | | 257/98 |
| 2016/0315068 A1* | 10/2016 | Lee | H01L 25/0753 |

* cited by examiner

*Primary Examiner* — Ali Naraghi
(74) *Attorney, Agent, or Firm* — Birch, Stewart, Kolasch & Birch, LLP

(57) ABSTRACT

Disclosed is a semiconductor light emitting device, wherein the semiconductor light emitting device includes: a first conductive electrode and a second conductive electrode; a first conductive semiconductor layer having the first conductive electrode; a second conductive semiconductor layer overlapped with the first conductive semiconductor layer, and having the second conductive electrode; and a passivation layer formed to enclose the semiconductor light emitting device, wherein one surface of the first conductive semiconductor layer is divided into a first region where the first conductive electrode is disposed, and a second region covered by the passivation layer, and wherein the passivation layer is provided with a plurality of layers having different refractive indexes, such that light is reflected from the second region.

13 Claims, 7 Drawing Sheets

VEHICLE LAMP USING SEMICONDUCTOR LIGHT EMITTING DEVICE

BACKGROUND OF THE INVENTION

1. Field of the Invention

The present invention relates to a vehicle lamp (or car lamp), and more particularly, a vehicle lamp using a semiconductor light emitting device.

2. Description of the Conventional Art

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economic efficiency by virtue of a semi-permanent lifespan, but most of the LEDs are currently produced in a form of a package. The LED itself other than the package is under development as a semiconductor light emitting device of converting a current into light, namely, an image displaying light source equipped in an electronic device such as an information communication device.

Vehicle lamps using the LEDs in the package form have disadvantages, such as a low mass production yield rate, high fabrication costs and low flexibility. Therefore, attempts to apply a surface light source using the semiconductor light emitting device itself other than the package type to the vehicle lamp are currently undergoing. However, the semiconductor light emitting devices of a micro unit have a low area occupied by conductive electrodes, than general LEDs. Thus, in case of the semiconductor light emitting devices of a micro unit, a light loss region where light is lost to the outside at an outer side of the conductive electrodes may be larger than that of general LEDs. Accordingly, the present invention provides a structure of semiconductor light emitting devices capable of effectively removing a light loss region.

SUMMARY OF THE INVENTION

The present invention has been made in an effort to solve the aforementioned problems, and an aspect of the present invention is to provide a semiconductor light emitting device of a micro unit.

Another aspect of the detailed description is to provide a vehicle lamp capable of preventing occurrence of an optical loss from a lower surface of semiconductor light emitting devices.

To achieve these and other advantages and in accordance with the purpose of this specification, as embodied and broadly described herein, there is provided a vehicle lamp having a passivation layer where a material having a high refractive index and a material having a low refractive index are repeatedly laminated on each other at an outer region of a conductive electrode of a semiconductor light emitting device of a micro unit.

More specifically, there is provided a semiconductor light emitting device, wherein the semiconductor light emitting device includes: a first conductive electrode and a second conductive electrode; a first conductive semiconductor layer having the first conductive electrode; a second conductive semiconductor layer overlapped with the first conductive semiconductor layer, and having the second conductive electrode; and a passivation layer formed to enclose the semiconductor light emitting device. One surface of the first conductive semiconductor layer is divided into a first region where the first conductive electrode is disposed, and a second region covered by the passivation layer. And the passivation layer is provided with a plurality of layers having different refractive indexes, such that light is reflected from the second region.

The passivation layer includes a first part which covers side surfaces of the semiconductor light emitting device, and a second part which covers one surface of the first conductive semiconductor layer. And the second part is formed of the plurality of layers.

The second part is extended toward the first region so as to cover at least part of the first conductive electrode. A through hole is formed at the second part such that the first conductive electrode is exposed to outside therethrough. The first part is formed as a single layer.

A material having a relatively high refractive index and a material having a relatively low refractive index are repeatedly laminated on each other at the plurality of layers. A layer having a relatively low refractive index between the plurality of layers comes in direct contact with the first region.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 1B is an enlarged view illustrating a state that the rear lamp of FIG. 1A is turned on;

DETAILED DESCRIPTION OF THE INVENTION

Figure 1A:
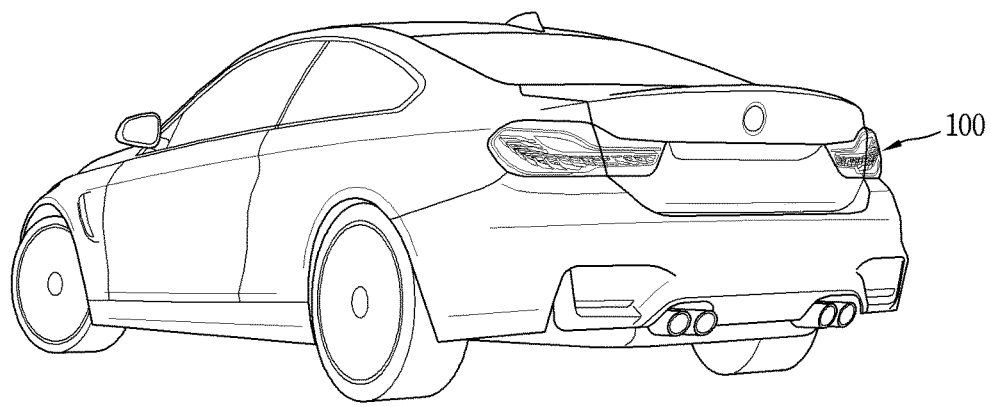
FIG. 1A is a conceptual view illustrating a rear lamp as one embodiment of a vehicle lamp.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention.

Also, the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the other element or an intermediate element may also be interposed therebetween.

A semiconductor light emitting device of a micro unit is included in a display device, a backlight device, a vehicle lamp, and the like.

The display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

The vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1B:
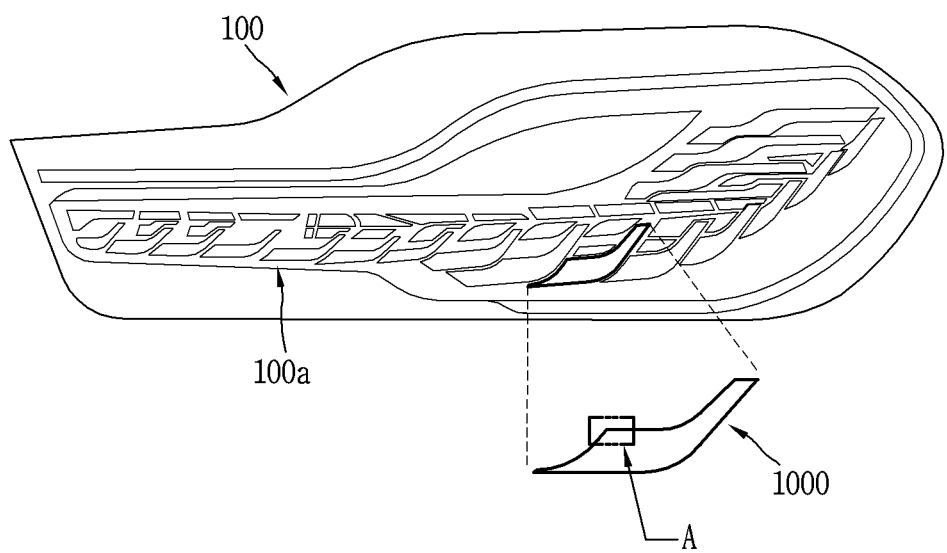

FIG. 1A is a conceptual view illustrating a rear lamp as one embodiment of a vehicle lamp, and FIG. 1B is an enlarged view illustrating a state in which the rear lamp of FIG. 1A is turned on.

Referring to FIG. 1A, a rear lamp 100 of a vehicle is disposed on each of both sides of a rear surface of the vehicle, thereby forming rear appearance of the vehicle.

The rear lamp 100 may be a lamp in which a tail lamp, a turn signal lamp, a brake lamp, an emergency lamp, and a backup lamp are combined in a package form. That is, the rear lamp 100 includes a plurality of lamps selectively emitting light according to the control of the vehicle.

In this instance, at least one of the plurality of lamps may be configured to emit light in a preset shape. As one example, a brake lamp 100a may be formed long in a horizontal direction and have at least part curved in a vertical direction, such that light is emitted in a shape corresponding to the shape of the brake lamp 100a. In addition, the brake lamp 100a may be bent toward the front of the vehicle. Such three-dimensional complex shape may be realized by a plurality of light emitting regions.

Referring to FIG. 1B, the preset shape is realized by combining light emitting regions with different shapes.

A light source unit 1000 implemented by a semiconductor light emitting device may be disposed on the light emitting region. The light source unit 1000 may be fixed to a vehicle body through a frame, and a wiring line for supplying power to the light source unit 1000 may be connected to the frame.

The light source unit may be a flexible light source unit that can be curved, bent, twisted, folded or rolled by an external force. The light source unit may also be a surface light source having a light emitting surface corresponding to the light emitting region.

In this instance, the light source unit 1000 may be provided in plurality to be arranged on the light emitting regions, respectively, or be configured as a single light emitting unit so as to realize the entire preset shape.

A pixel of the light source unit 1000 may be implemented by a semiconductor light emitting device. In the present invention, a light emitting diode (LED) is exemplarily employed as one type of semiconductor light emitting device for converting a current into light. The LED may be a light emitting device having a size ranging from several to several tens of micrometers, and may serve as a pixel on the three-dimensional space.

In the present invention, it is difficult to increase a brightness of the vehicle lamp device because a size of the semiconductor light emitting devices is small, at the light source unit. That is, there is a limitation in increasing the brightness, since an upper surface of the semiconductor light emitting devices where light is emitted has a small area. The present invention provides a novel type of semiconductor light emitting device which can solve such a problem.

Figure 2:
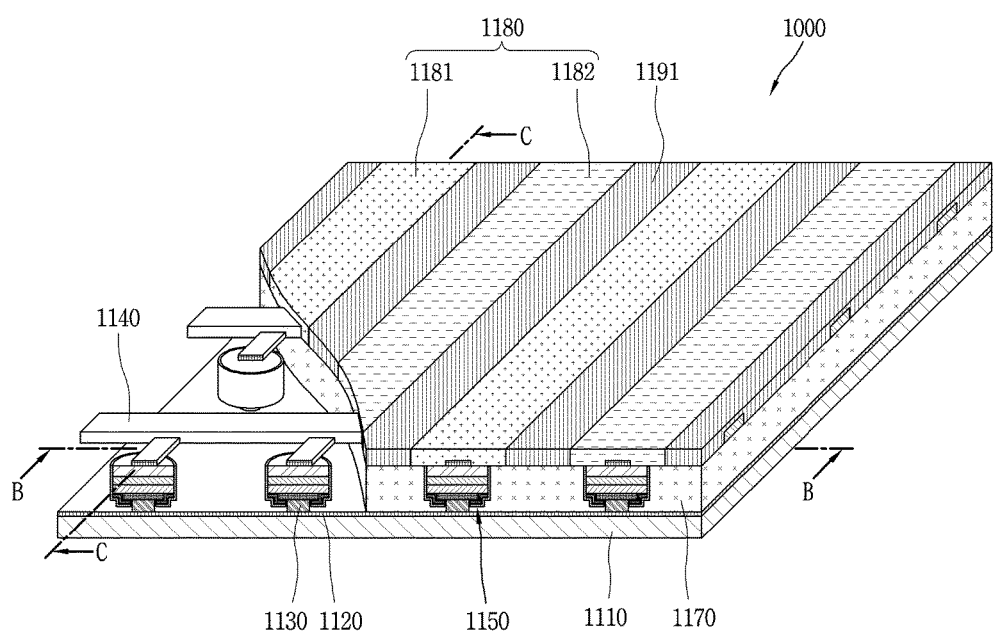
FIG. 2 is an enlarged view of part 'A' shown in FIG. 1B, which explains another embodiment of the present invention where semiconductor light emitting devices of a novel structure have been applied.
Figure 3:
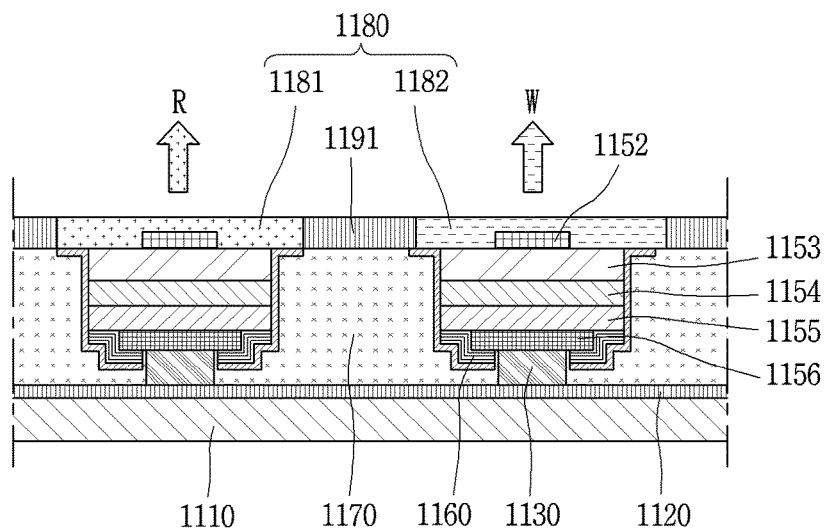
FIG. 3 is a sectional view taken along line 'B-B' in FIG. 2.
Figure 4:
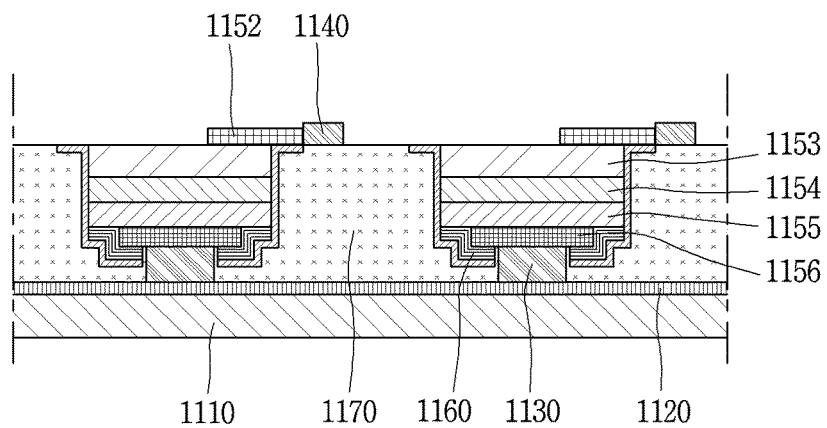
FIG. 4 is a sectional view taken along line 'C-C' in FIG. 2.
Figure 5A:
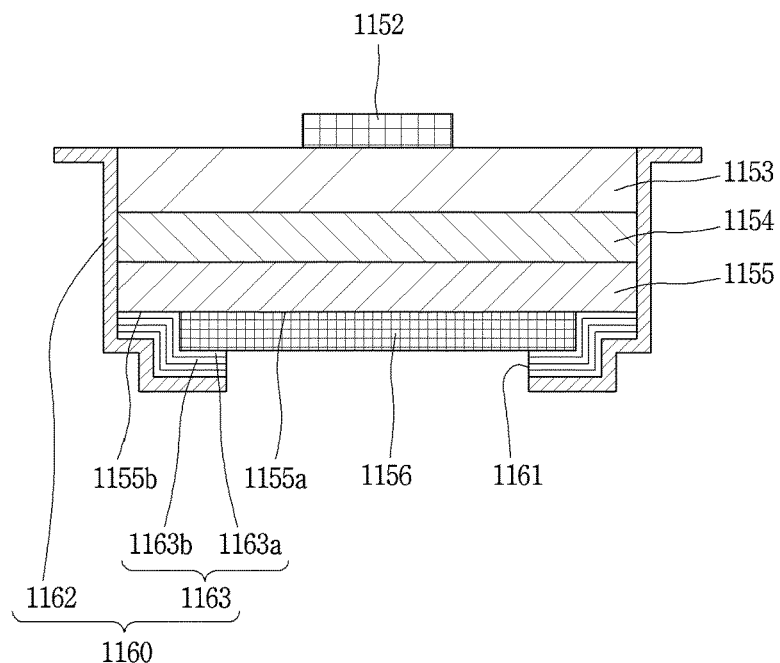
FIG. 5A is a conceptual view illustrating the semiconductor light emitting devices of a novel structure shown in FIG. 2.
Figure 5B:
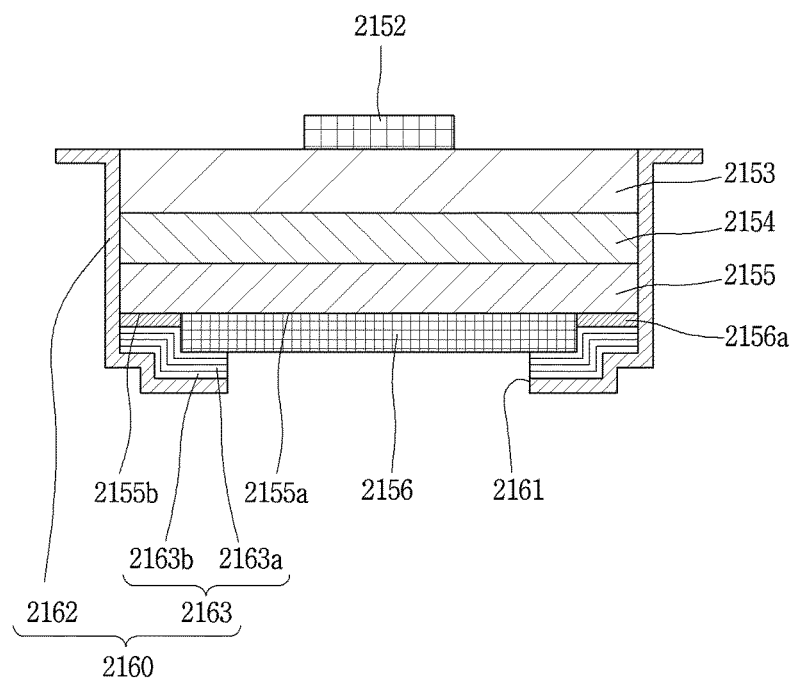
FIG. 5B is conceptual views illustrating different embodiments of the present invention.
Figure 6:
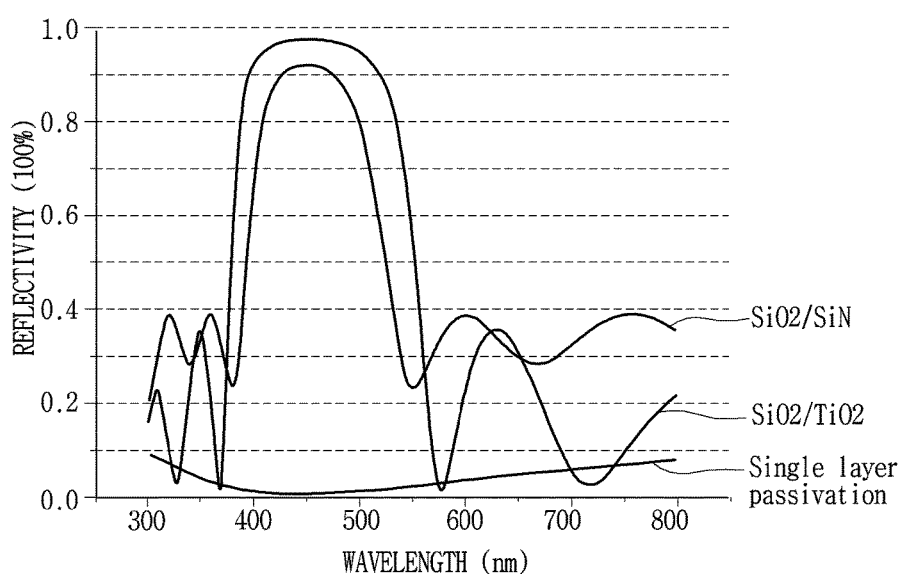
FIG. 6 is a graph illustrating a reflectivity according to a material of a passivation layer.
Figure 7:
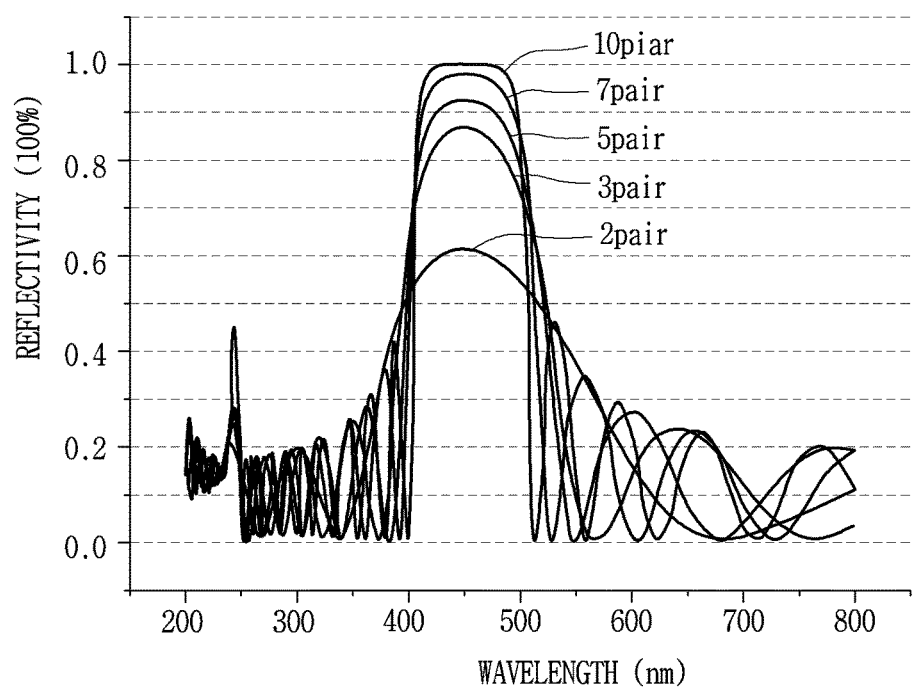
FIG. 7 is a graph illustrating a reflectivity according to the number of a plurality of layers repeatedly laminated on each other.

FIG. 2 is an enlarged view of part 'A' shown in FIG. 1B, which explains another embodiment of the present invention where semiconductor light emitting devices of a novel structure have been applied. FIG. 3 is a sectional view taken along line 'B-B' in FIG. 2. FIG. 4 is a sectional view taken along line 'C-C' in FIG. 2. FIG. 5A is a conceptual view illustrating the semiconductor light emitting devices of a novel structure shown in FIG. 2. FIG. 5B is conceptual views illustrating different embodiments of the present invention. FIG. 6 is a graph illustrating a reflectivity according to a material of a passivation layer. And FIG. 7 is a graph illustrating a reflectivity according to the number of a plurality of layers repeatedly laminated on each other.

Referring to FIGS. 2, 3, 4 and 5A, as the light source unit 1000 using semiconductor light emitting devices, passive matrix (PM) type vertical semiconductor light emitting devices are used. However, in the following descriptions, active matrix (AM) type semiconductor light emitting devices may be also applied.

The light source unit 1000 includes a substrate 1110, a first wire 1120, a conductive layer 1130, a second wire 1140, and a plurality of semiconductor light emitting devices 1150.

The substrate 1110 may be a flexible substrate. For instance, the substrate 1110 may include glass or polyimide (PI) in order to implement the light source unit. The substrate 1110 may be formed of any material having an insulation property and flexibility, such as Polyethylene Naphthalate (PEN) and Polyethylene Terephthalate (PET). The substrate 110 may be formed of a transparent material or an opaque material.

At least one of the first wire 1120 and the second wire 1140 may be provided with a planar electrode. For instance, the first wire 1120 is formed as a planar electrode, and the second wire 1140 is formed as a plurality of electrode lines.

For instance, the first wire 1120 may be positioned on one surface of the substrate 1110, and may be formed as a planar electrode. The first wire 1120 may be an electrode layer disposed on the substrate 110, and may serve as a data electrode. As another example, the first wire 1120 may be formed as a bar type electrode which is long in one direction.

The first wire 1120 in the planar shape is the first surface electrode, and may be a common electrode surface that covers the plurality of semiconductor light emitting devices 1150 such that light can be reflected between the plurality of semiconductor light emitting devices 1150. With such a configuration, a structure of an electrode layer of high reflection may be implemented, and light efficiency may be enhanced. The planar electrode may be overlapped with 10 to 100000 semiconductor light emitting devices, and the plurality of semiconductor light emitting devices 1150 cover the planar electrode in the form of arrays.

The conductive layer 1130 may be soldered by a soldering material. For instance, the soldering material may be at least one of Sb, Pd, Ag, Au and Bi. In this case, the soldering material may be applied to the first wire 1120 of the substrate, and a soldering process may be performed by using thermal energy. Alternatively, the soldering material may be applied to the semiconductor light emitting devices, and a soldering process may be performed by using thermal energy.

The semiconductor light emitting devices 1150 are connected to the first wire 1120 through the conductive layers 1130, and constitute unit pixels at the light source unit 1000. The semiconductor light emitting devices 1150 may constitute the unit pixels even with a small size, due to their excellent brightness. The semiconductor light emitting device 1150 may have a size such that a length of its one edge is less than 80 μm, and may be formed to have a rectangular shape or a square shape. In case of a rectangular shape, the semiconductor light emitting device 1150 may have a size of 20×80 μm or less.

In this case, an insulating layer 1170 may be applied onto one surface of the substrate so as to fill the gap between the plurality of semiconductor light emitting devices 1150.

As shown, the second wire 1140 may be disposed on the insulating layer 1170. That is, the insulating layer 1170 is disposed between the substrate and the second wire 1140. The second wire 1140 may be electrically connected to the plurality of semiconductor light emitting devices 1150 by contact.

As another example, the conductive layer 1130 may be a layer having an adhesion property and conductivity. For this, the conductive layer 1130 may be formed of a conductive material and an adhesive material mixed with each other. The conductive layer 1130 has a ductility, and performs a flexible function in the vehicle lamp.

For instance, the conductive layer 1130 may be implemented as an anisotropic conductive film (ACF), an anisotropic conductive paste, a solution containing conductive particles, etc. The conductive layer 1130 may be formed as a layer which allows an electrical connection in a Z-direction, but which has an electrical insulation property in a horizontal direction (X-Y). Thus, the conductive layer 1130 may be referred to as a 'Z'-axis conductive layer.

The anisotropic conductive film (ACF) is formed as an anisotropic conductive medium is mixed with an insulating base member, and only a part thereof has conductivity by the anisotropic conductive medium when heat and pressure are applied thereto. Hereinafter, the following descriptions will be performed under an assumption that heat and pressure are applied to the anisotropic conductive film (ACF). However, another method may be implemented in order for the anisotropic conductive film (ACF) to have conductivity partially. For instance, only one of heat and pressure may be applied, or a UV hardening process may be performed.

Since the anisotropic conductive film (ACF) contains an adhesive material, the conductive layer 1130 implements an electrical connection as well as a mechanical coupling, between the semiconductor light emitting devices 1150 and the first wire 1120.

In this case, the anisotropic conductive medium may be conductive balls or conductive particles. As shown, the anisotropic conductive film is implemented as conductive balls are mixed with an insulating base member, and only a specific part thereof has conductivity by the conductive balls when heat and pressure are applied thereto. The anisotropic conductive film may contain a plurality of particles, each particle formed as a conductive core is coated by an insulating film formed of a polymer material. In this case, as a part of the insulating film where heat and pressure have been applied is destroyed, conductivity is implemented by the core. Here, as the core is transformed, a layer which contacts the core in a thickness direction of the anisotropic conductive film may be formed. More specifically, heat and pressure are entirely applied to the anisotropic conductive film, and an electrical connection in a Z-axis direction is partially formed by a height difference between the core and an object adhered to each other by the anisotropic conductive film.

Further, the light source unit 1000 may be further provided with a phosphor layer 1180 formed on one surface of the semiconductor light emitting devices 1150. For instance, the semiconductor light emitting devices 1150 are blue semiconductor light emitting devices which emit light of a blue color (B), and the phosphor layer 1180 converts the light of a blue color (B) into a color of unit pixels. The phosphor layer 1180 may be a red phosphor 1181 or a yellow phosphor 1182 which constitutes unit pixels. That is, the red phosphor 1181 for converting blue light (B) into red light (R) may be laminated on the blue semiconductor light emitting devices at red pixel positions. And the yellow phosphor 1182 for converting blue light (B) into white light (W) may be laminated on the blue semiconductor light emitting devices at white pixel positions.

With such a configuration, the rear lamp which selectively outputs red light or white light may be implemented.

The vehicle lamp may further include a black matrix 1191 disposed between the phosphors for an enhanced contrast ratio of the phosphor layer 1180. The black matrix 1191 may be implemented as a gap is formed between phosphor dots and a black material is filled in the gap. With such a configuration, the black matrix 1191 may absorb external reflected light, and may enhance a contrast of light and darkness.

In this embodiment, the semiconductor light emitting devices 1150 have a great advantage to reduce a chip size, because electrodes are disposed up and down. However, since the electrodes are disposed up and down, an upper area of the semiconductor light emitting devices 1150 where light is emitted is reduced.

When each of a horizontal length and a vertical length of the semiconductor light emitting device 1150 is within 10~100 μm, a large amount of optical loss is generated from the semiconductor light emitting device 1150. Thus, the semiconductor light emitting device 1150 has a mechanism to totally reflect light from a lower surface thereof.

As shown, each of the semiconductor light emitting devices 1150 includes a first conductive electrode 1156, a first conductive semiconductor layer 1155 having the first conductive electrode 1156, an activation layer 1154 formed on the first conductive semiconductor layer 1155, a second conductive semiconductor layer 1153 formed on the activation layer 1154, and a second conductive electrode 1152 formed on the second conductive semiconductor layer 1153.

The first conductive semiconductor layer 1155 and the second conductive semiconductor layer 1153 are overlapped with each other, and the second conductive electrode 1152 is disposed on an upper surface of the second conductive semiconductor layer 1153. And the first conductive electrode 1156 is disposed on a lower surface of the first conductive semiconductor layer 1155. In this case, the upper surface of the second conductive semiconductor layer 1153 may be one surface of the second conductive semiconductor layer 1153 which is farthest from the first conductive semiconductor layer 1155. And the lower surface of the first conductive semiconductor layer 1155 may be one surface of the first conductive semiconductor layer 1155 farthest from the second conductive semiconductor layer 1153. The first conductive electrode 1156 and the second conductive electrode 1152 are disposed up and down in a state that the first conductive semiconductor layer 1155 and the second conductive semiconductor layer 1153 are interposed therebetween.

In this case, the lower surface of the first conductive semiconductor layer 1155 may be a surface closest to the substrate, and the upper surface of the second conductive semiconductor layer 1153 may be a surface closest to the substrate.

More specifically, the first conductive electrode 1156 and the first conductive semiconductor layer 1155 may be a 'p'-type electrode and a 'p'-type semiconductor layer, respectively. And the second conductive electrode 1152 and the second conductive semiconductor layer 1153 may be an 'n'-type electrode and an 'n'-type semiconductor layer, respectively. In this case, the 'n'-type electrode disposed at an upper side may be electrically connected to the second wire 1140 by the conductive layer 1130, and the 'p'-type electrode disposed at a lower side may be electrically connected to the first wire 1120. However, the present invention is not limited to this. That is, the first conductive type may be an 'n'-type, and the second conductive type may be a 'p'-type.

According to another embodiment of the present invention, the first conductive semiconductor layer and the second conductive semiconductor layer may be formed by injecting impurities onto an intrinsic or doped semiconductor substrate. As the impurities are injected, a 'p-n' bonded region may serve as the activation layer. Accordingly, the aforementioned descriptions about the 'p'-type semiconductor layer, the 'n'-type semiconductor layer, and the activation layer are merely exemplary, and the present invention is not limited to this.

The semiconductor light emitting device 1150 includes a passivation layer 1160 formed to enclose side surfaces of the first conductive semiconductor layer 1155 and the second conductive semiconductor layer 1153.

The passivation layer 1160 is configured to enclose side surface of the semiconductor light emitting device for stability of the semiconductor light emitting device, and is formed of an insulating material. Since the first conductive semiconductor layer 1155 and the second conductive semiconductor layer 1153 are electrically insulated from each other by the passivation layer 1160, the P-type GaN and the N-type GaN of the semiconductor light emitting device may be insulated from each other.

As shown, one surface of the first conductive semiconductor layer 1155 is divided into a first region 1155a where the first conductive electrode 1156 is disposed, and a second region 1155b covered by the passivation layer 1160.

In this case, the passivation layer 1160 is provided with a through hole 1161 through which the first conductive electrode 1156 is exposed. The first conductive electrode 1156 is exposed to the outside via the through hole 1161. In this case, the first conductive electrode 1156 may be provided with a plurality of metallic layers formed of different metallic materials. For instance, a plurality of metallic layers formed of Ti, Pt, Au, Ti, Cr, etc. may be laminated on each other, thereby forming the 'p'-type electrode.

As shown, the passivation layer 1160 is provided with a plurality of layers having different refractive indexes, such that light is reflected from the second region 1155b.

The second region 1155b is a light loss region where light generated from the semiconductor light emitting device is lost to the outside. However, in the present invention, a reflection mechanism is provided to the optical loss region through the passivation layer 1160.

The second region may have an area corresponding to 30 to 40% of an entire area of one surface of the first conductive semiconductor layer. For instance, when a semiconductor light emitting device has an area of 50 µm by 50 µm, the first conductive electrode 1156 may have an area of 30 µm by 30 µm, in a micro unit. In this case, a size of the second region may be about 35% of the entire area of the first conductive semiconductor layer. Accordingly, the second region may have a size corresponding to 30 to 40% of the entire are of the first conductive semiconductor layer, which is a very large ratio.

More specifically, the passivation layer includes a first part 1162 which covers the side surfaces of the semiconductor light emitting device, and a second part 1163 which covers one surface of the first conductive semiconductor layer. And the second part 1163 is extended from the first part 1162, thereby covering a lower surface of the semiconductor light emitting device. The second part 1163 is extended toward the first region so as to cover at least part of the first conductive electrode 1156. And the through hole 1161 is formed at the second part 1163 such that the first conductive electrode 1156 is exposed to the outside therethrough.

In this case, the second part 1163 may be formed of a plurality of layers 1163a, 1163b.

A material having a relatively high refractive index and a material having a relatively low refractive index may be repeatedly laminated on each other at the plurality of layers 1163a, 1163b. The material having a relatively high refractive index may include at least one of SiN, $TiO_2$, $Al_2O_3$, and $ZrO_2$, and the material having a relatively low refractive index may include $SiO_2$. And a refractive index difference between the material having a relatively high refractive index and the material having a relatively low refractive index may be 0.3 or more. For instance, the refractive index difference between the material having a relatively high refractive index and the material having a relatively low refractive index may be 0.3~0.9.

Light efficiency of a semiconductor light emitting device such as a light emitting diode is determined by quantum efficiency inside the semiconductor light emitting device and light extraction efficiency. When light generated from a multiple quantum well inside a light emitting diode is emitted to the outside, a threshold angle to emit light is reduced due to a refractive index difference between gallium nitride (refractive index: 2.4) and air (refractive index: 1). As a result, an optical loss occurs.

Semiconductor light emitting devices of a micro unit are separated from each other. Accordingly, if light emitted from side surfaces of the light emitting devices to the outside is collected into the light emitting devices, light extraction efficiency may be increased. In the present invention, dielectric layers having a refractive index difference are repeatedly laminated on the passivation layer 1160 of the semiconductor light emitting device, and light is collected into the semiconductor light emitting device by controlling an emittance angle of light. More specifically, the passivation layer 1160 has a structure where a material having a low refractive index ($SiO_2$ etc.) and a material having a high refractive index SiN, $TiO_2$, $Al_2O_3$, $ZrO_2$, etc.) at a specific wavelength are alternately laminated on each other. Accordingly, the passivation layer 1160 changes a path of light generated from the inside of the semiconductor light emitting device by using two materials having a refractive index difference therebetween of 0.3 or more, thereby preventing loss of light generated from a lower surface of the semiconductor light emitting device to the outside.

As shown, the layer 1163a (first layer) having a relatively low refractive index between the plurality of layers 1163a, 1163b comes in direct contact with the first region 1155a, and a material provided at the first layer 1163a of a low refractive index has a refractive index lower than that of the first conductive semiconductor layer 1155. And a material provided at the second layer 1163b of a high refractive index may have a refractive index higher than that of the first layer 1163a.

The passivation layer 1160 may be formed on the side surfaces of the semiconductor light emitting device as a single layer. The thickness of the single layer is less than a total thickness of the plurality of layers 1163a, 1163b, For instance, the first part 1162 may be formed as the single layer, and the single layer may be extended from the side surfaces of the semiconductor light emitting device towards one surface of the semiconductor light emitting device so as to cover the second part 1163. Thus, the second part 1163 is covered by the layer extended from the first part 1162, and the single layer may be disposed on an outermost side of the passivation layer 1160. That is, the present invention may have a structure where the first part 1162 entirely encloses the semiconductor light emitting device, and the second part 1163 is disposed between the first part 1162 and a lower surface of the first conductive semiconductor layer 1155.

Once a material having a high refractive index and a material having a low refractive index are repeatedly laminated on each other by using a principle of dielectric HR multi layers, a high reflection (HR) effect may be implemented as a constructive interference occurs at a specific wavelength due to interference of light. Further, the single layer covers the region where the material having a high refractive index and the material having a low refractive index are repeatedly laminated on each other, thereby protecting the region together with the side surfaces of the semiconductor light emitting device.

As another example, referring to FIG. 5B, an adhesive electrode 2156a may be disposed between the second region 2155b and the passivation layer 2160. An insulating interface may be formed between the first conductive electrode 2156 and the second region 2155b, and the adhesive electrode 2156a may be disposed at the insulating interface. As the adhesive electrode 2156a is disposed, an adhesive force between the second region 2155b and the material having a low refractive index may be enhanced. The adhesive electrode 2156a may include at least one of titanium (Ti), chrome (Cr) and nickel (Ni). And the adhesive electrode 2156a may be formed to have a thickness of 1 nm to 10 nm. The adhesive electrode is merely exemplary, and the present invention is not limited to this. In this case, referring to FIG. 6 illustrating a reflectivity according to a material of the passivation layer, it may be seen that a reflectivity is increased as a refractive index difference between first and second layers is large. Further, referring to FIG. 7 illustrating a reflectivity according to the number of a plurality of thin films laminated on each other, it may be seen that a reflectivity at a specific wavelength is increased as the number of thin films laminated on each other is increased.

FIG. 6 illustrates a reflectivity difference at a specific wavelength, among a single layer passivation (SiO2), a multi-layer passivation formed of thin films (SiO2/TiO2), and a multi-layer passivation formed of thin films (SiO2/SiN). Here, the SiO2 is used as a material having a low refractive index (the refractive index at a wavelength of 450 nm is 1.5), SiN is used as a material having a high refractive index (the refractive index at a wavelength of 450 nm is 2), and TiO2 is used as a material having a high refractive index (the refractive index at a wavelength of 450 nm is 2.3). In case of using the single layer passivation (SiO2), a reflectivity is almost zero at a wavelength of 450 nm. On the other hand, in case of using the multi-layer passivation formed of thin films (SiO2/SiN), a reflectivity is about 90% at the same wavelength of 450 nm. And in case of using the multi-layer passivation formed of thin films (SiO2/TiO2), a reflectivity is about 98% at the same wavelength of 450 nm.

Referring to FIG. 7, in case of using thin films of SiO2/TiO2, a reflectivity is changed according to the number of thin films laminated on each other. More specifically, the reflectivity is increased as the number of thin films laminated on each other is increased. The reflectivity of 98% or more may be obtained by controlling dielectric film materials used as the passivation layer, and the number of thin films laminated on each other. This may allow the thin films to have a more excellent reflectivity than general metallic thin films formed of Ag or Al.

In this case, a pair of the material having a high refractive index and the material having a low refractive index may be repeatedly laminated on each other 3 to 10 times. Referring to FIG. 7, it can be seen that reflectivity is drastically increased when the number of times that the pair of the material having a high refractive index and the material having a low refractive index are repeatedly laminated on each other is 3 or more.

As the passivation layer is formed of a plurality of layers on the lower surface of the semiconductor light emitting device, a vehicle lamp having an enhanced brightness may be implemented.

The vehicle lamp of the present invention may have the following advantages.

Firstly, reflection may be induced from a lower surface of the semiconductor light emitting device, by using a plurality of layers having different refractive indexes. Through the reflection, light generated from a part not covered by the conductive electrode on the lower surface of the semiconductor light emitting device, is induced upward. Especially, in case of small semiconductor light emitting devices, the amount of light emitted to a part not covered by the conductive electrode is increased. This may greatly enhance a brightness of the vehicle lamp through the reflection.

Further, in the present invention, light generated from the inside of the light emitting device is emitted to the outside without a light loss region, through the passivation layer. This may enhance light extraction efficiency, and may lower power consumption of a light source.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A semiconductor light emitting device includes:
   a first conductive electrode and a second conductive electrode;
   a first conductive semiconductor layer having the first conductive electrode;
   a second conductive semiconductor layer overlapped with the first conductive semiconductor layer, and having the second conductive electrode; and
   a passivation layer formed to enclose the semiconductor light emitting device,
   wherein one surface of the first conductive semiconductor layer is divided into a first region where the first conductive electrode is disposed, and a second region covered by the passivation layer,
   wherein the passivation layer is provided with a plurality of layers having different refractive indexes, such that light is reflected from the second region,
   wherein the passivation layer includes a first part which covers side surfaces of the semiconductor light emitting device, and a second part which covers one surface of the first conductive semiconductor layer,
   wherein the first part is formed as a single layer, and
   wherein the second part is formed of the plurality of layers.

2. The semiconductor light emitting device of claim 1, wherein the second part is extended toward the first region so as to cover at least part of the first conductive electrode.

3. The semiconductor light emitting device of claim 1, wherein a through hole is formed at the second part such that the first conductive electrode is exposed to outside therethrough.

4. The semiconductor light emitting device of claim 1, wherein the single layer is extended from side surfaces of the semiconductor light emitting device towards one surface of the semiconductor light emitting device so as to cover the second part.

5. The semiconductor light emitting device of claim 1, wherein a thickness of the single layer is less than a total thickness of the plurality of layers having different refractive indexes.

6. The semiconductor light emitting device of claim 1, wherein a material having a relatively high refractive index and a material having a relatively low refractive index are repeatedly laminated on each other at the plurality of layers.

7. The semiconductor light emitting device of claim 6, wherein the material having the relatively high refractive index includes at least one of $SiN$, $TiO_2$, $Al_2O_3$, and $ZrO_2$, and the material having the relatively low refractive index includes $SiO_2$.

8. The semiconductor light emitting device of claim 1, wherein a layer having a relatively low refractive index between the plurality of layers comes in direct contact with the first region.

9. The semiconductor light emitting device of claim 1, wherein the first conductive electrode and the second conductive electrode are disposed up and down in a state that the first conductive semiconductor layer and the second conductive semiconductor layer are interposed therebetween.

10. The semiconductor light emitting device of claim 1, wherein the second region has an area corresponding to 30 to 40% of an area of one surface of the first conductive semiconductor layer.

11. The semiconductor light emitting device of claim 1, wherein an adhesive electrode is disposed between the second region and the passivation layer.

12. The semiconductor light emitting device of claim 11, wherein the adhesive electrode includes one of chrome and nickel.

13. A vehicle lamp having a plurality of semiconductor light emitting devices, wherein at least one of the semiconductor light emitting devices includes:
   a first conductive electrode and a second conductive electrode;
   a first conductive semiconductor layer having the first conductive electrode;
   a second conductive semiconductor layer overlapped with the first conductive semiconductor layer, and having the second conductive electrode; and
   a passivation layer formed to enclose the semiconductor light emitting device,
   wherein one surface of the first conductive semiconductor layer is divided into a first region where the first conductive electrode is disposed, and a second region covered by the passivation layer,
   wherein the passivation layer is provided with a plurality of layers having different refractive indexes, such that light is reflected from the second region,
   wherein the passivation layer includes a first part which covers side surfaces of the semiconductor light emitting device, and a second part which covers one surface of the first conductive semiconductor layer,
   wherein the first part is formed as a single layer, and
   wherein the second part is formed of the plurality of layers.

* * * * *